United States Patent
Jenkins et al.

(10) Patent No.: US 10,054,995 B2
(45) Date of Patent: Aug. 21, 2018

(54) ADDITIVE MANUFACTURED PASSIVE THERMAL ENCLOSURE

(71) Applicant: Microsoft Technology Licensing, LLC, Redmond, WA (US)

(72) Inventors: Kurt Jenkins, Sammamish, WA (US); Andrew Douglas Delano, Woodinville, WA (US); Lincoln Ghioni, Redmond, WA (US); Jeffrey Taylor Stellman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/336,635

(22) Filed: Oct. 27, 2016

(65) Prior Publication Data
US 2018/0120912 A1    May 3, 2018

(51) Int. Cl.
| | |
|---|---|
| *F28F 7/00* | (2006.01) |
| *G06F 1/20* | (2006.01) |
| *B33Y 80/00* | (2015.01) |
| *B33Y 70/00* | (2015.01) |
| *B23K 26/342* | (2014.01) |

(Continued)

(52) U.S. Cl.
CPC ............ *G06F 1/206* (2013.01); *B23K 26/342* (2015.10); *B23P 15/26* (2013.01); *B33Y 70/00* (2014.12); *B33Y 80/00* (2014.12); *B23K 2201/14* (2013.01); *B23P 2700/09* (2013.01)

(58) Field of Classification Search
CPC ....................................................... F28D 15/04
USPC .................................................. 361/679.38
See application file for complete search history.

(56) References Cited

U.S. PATENT DOCUMENTS

| | | |
|---|---|---|
| 8,718,522 B2 | 5/2014 | Chillscyzn et al. |
| 8,739,406 B2 | 6/2014 | Campbell et al. |
| 9,254,535 B2 | 2/2016 | Buller et al. |

(Continued)

FOREIGN PATENT DOCUMENTS

| | | |
|---|---|---|
| EP | 2527776 A1 | 11/2012 |
| WO | 2015095107 A1 | 6/2015 |
| WO | 2016012467 A1 | 1/2016 |

OTHER PUBLICATIONS

Scott J Grunewald, "Trumpf is Covering All of its Bases by Offering a Full Range of Laser Metal 3D Printers", Published on: Dec. 10, 2015 Available at: https://3dprint.com/110285/trumpf-metal-3d-printers/.

(Continued)

*Primary Examiner* — Jerry Wu
(74) *Attorney, Agent, or Firm* — Lempia Summerfield Katz LLC

(57) ABSTRACT

Thermal management devices and systems, and corresponding manufacturing methods are described herein. A thermal management device includes a plate having a first surface. The first surface partially defines a chamber of the thermal management device. The thermal management device also includes capillary features disposed on the plate, and walls having a first end and a second end. The walls are disposed on the plate and extend away from the first surface of the plate, at the first end, to the second end. The walls partially define the chamber of the thermal management device. The thermal management device also includes a layer of material disposed on the walls, at the second end of the wall. The layer of material partially defines the chamber.

7 Claims, 5 Drawing Sheets

(51) Int. Cl.
*B23P 15/26* (2006.01)
*B23K 101/14* (2006.01)

(56) References Cited

U.S. PATENT DOCUMENTS

| | | | |
|---|---|---|---|
| 2013/0312939 A1* | 11/2013 | Uchida | F28D 15/04 165/104.26 |
| 2014/0333011 A1 | 11/2014 | Javidan et al. | |
| 2014/0352926 A1 | 12/2014 | Sun et al. | |
| 2015/0053086 A1 | 2/2015 | Rebouillat et al. | |
| 2015/0119111 A1 | 4/2015 | Honmura et al. | |
| 2015/0188019 A1 | 7/2015 | Corrado | |
| 2016/0069622 A1 | 3/2016 | Alexiou et al. | |
| 2016/0102854 A1 | 4/2016 | Xiang | |

OTHER PUBLICATIONS

Kuneinen, Eetu, "Building Enclosures with a 3D Printer", Published on: Dec. 13, 2012 Available at: http://3dprintingindustry.com/news/building-enclosures-with-a-3d-printer-3954/.

Walter, Moritz, "It's Time for Direct Metal 3D-Printing", Published on: May 19, 2016 Available at: http://hackaday.com/2016/05/19/its-time-for-direct-metal-3d-printing/.

Snyder, et al., "3D Systems' Technology Overview and New Applications in Manufacturing, Engineering, Science, and Education", In Journal of 3D Printing and Additive Manufacturing, vol. 1, Issue 3, Sep. 19, 2014, pp. 169-176.

Akins, Glen, "Building an Enclosure using SketchUp and 3D Printing", Published on: Jun. 1, 2014 Available at: http://bikerglen.com/blog/building-an-enclosure-using-sketchup-and-3d-printing/.

"International Search Report and Written Opinion Issued in PCT Application No. PCT/US2017/057068", dated Jan. 29, 2018, 15 Pages.

\* cited by examiner

ADDITIVE MANUFACTURED PASSIVE THERMAL ENCLOSURE

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
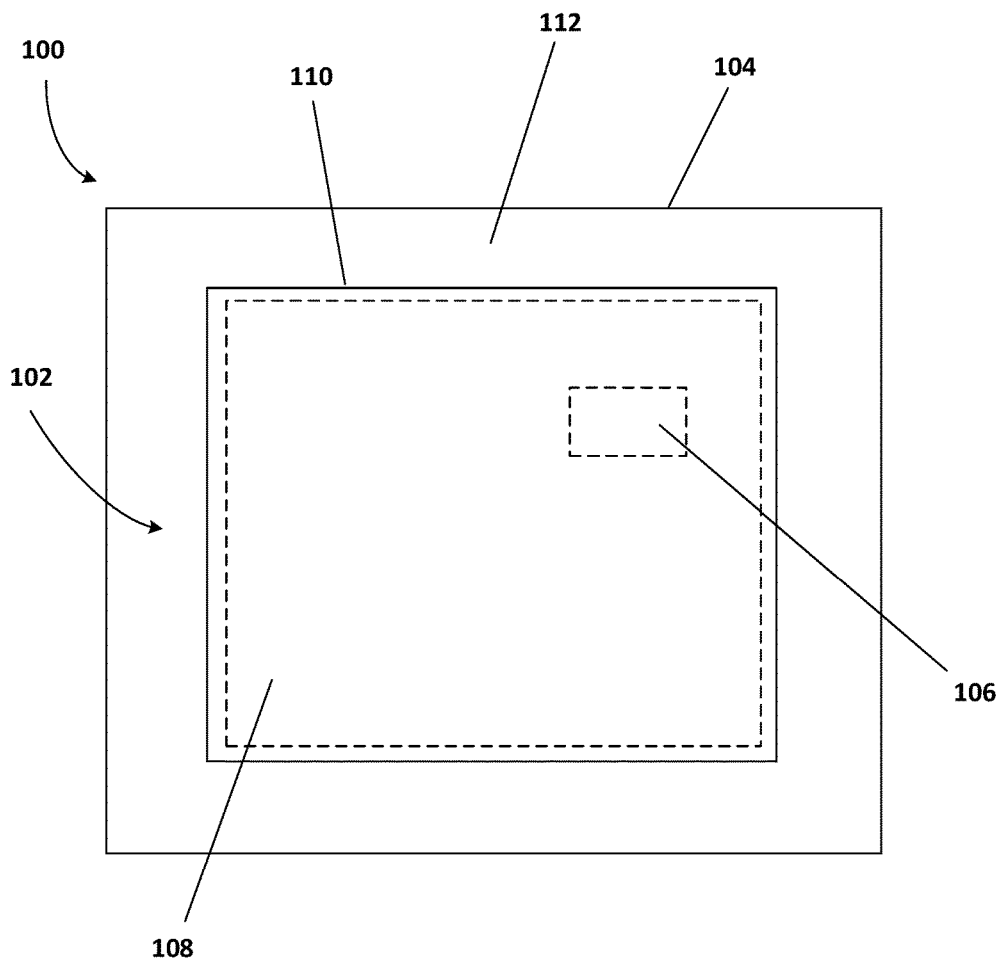
FIG. 1 depicts a top view of a portion of a computing device including an example of a passive thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform effectively. When overheating, electronic devices run slowly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. Depending on the thickness of the device, there may not be sufficient room within the device for active thermal management components such as, for example, fans. Passive thermal management may thus be relied on to cool the device. For example, buoyancy driven convection (i.e., natural convection) and radiation to the surroundings may be relied upon to cool the device. Assuming the size of a computing device, and thus a surface area for radiative heat transfer, is fixed, and a maximum temperature of an outside surface of the computing device is fixed by user comfort and safety limits, optimized heat rejection from the computing device, and thus a maximum steady state power level for the computing device, is provided when the maximum temperature of the outside surface of the computing device is constantly maintained.

Disclosed herein are apparatuses, systems, and methods for providing an isothermal surface of a computing device to maximize passive heat transfer (e.g., in the presence of a buoyancy driven flow) from the computing device. The improved passive heat transfer from the electronic device may be provided by a constant temperature process (e.g., condensation of a pure fluid such as water) on or near the surface. For example, a phase change device (e.g., a vapor chamber) that is thermally connected to a heat generating component within the computing device may be positioned adjacent to the surface. To minimize a distance between the surface and the phase change device, the phase change device is formed on an enclosure plate of the computing device. Walls and capillary features of the phase change device are formed directly on the enclosure plate with additive manufacturing (e.g., three-dimensional (3D) printing).

As an example, the improved heat dissipation from a computing device may be implemented by a thermal management device that includes a plate having a first surface. The first surface partially defines a chamber of the thermal management device. The thermal management device also includes capillary features disposed on the plate, and walls having a first end and a second end. The walls are disposed on the plate and extend away from the first surface of the plate, at the first end, to the second end. The walls partially define the chamber of the thermal management device. The thermal management device also includes a layer of material disposed on the walls, at the second end of the walls. The layer of material partially defines the chamber.

Such heat dissipation apparatuses or systems have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 depicts a top view of a portion of a computing device 100 including an example of a passive thermal management system 102 that is supported by a housing 104. In FIG. 1, a portion of the housing 104 is removed, and an interior of the housing 104 (e.g., largest cross-section of the housing) is shown. The computing device 100 may be any number of computing devices including, for example, a personal computer, a server computer, a tablet or other handheld computing device, a laptop or mobile computer, a communications device such as a mobile phone, a multi-processor system, a microprocessor-based system, a set top box, a programmable consumer electronic device, a network PC, a minicomputer, a mainframe computer, or an audio and/or video media player. The passive thermal management system 102 is, for example, at least partially additive manufactured.

The housing 104 supports at least the passive thermal management system 102 and a heat generating electrical device 106. The heat generating electrical device 106 may be any number of electrically powered devices including, for example, a processor, memory, a power supply, a graphics card, a hard drive, or other electrically powered devices. The heat generating electrical device 106 (e.g., a processor) may be supported by the housing 104 via, for example, a printed circuit board (PCB) 108 attached to and/or supported by the housing 104. The processor 106 is in communication with other electrical devices or components (not shown) of the computing device 100 via the PCB 108, for example. The computing device 100 may include a number of components not shown in FIG. 1 (e.g., a hard drive, a power supply, connectors).

The passive thermal management system 102 includes a phase change device 110. In the example shown in FIG. 1, the phase change device 110 is a vapor chamber. In other examples, the passive thermal management system 102 includes one or more additional and/or different phase change devices (e.g., one or more heat pipes).

The vapor chamber 110 abuts or is adjacent to the processor 106. The passive thermal management system 102 may be installed in a computing device where heat flux within the computing device does not reach levels high enough to prevent a working fluid within the vapor chamber 110 to return to a heat source (e.g., dry-out) such as, for example, the processor 106 (e.g., an evaporator). The working fluid may be any number of fluids including, for example, ammonia, alcohol, ethanol, or water.

The vapor chamber 110 may be any number of sizes and/or shapes. For example, as shown in FIG. 1, the vapor chamber 110 may be a rectangular flat vapor chamber (e.g., with rounder corners). The thickness of the vapor chamber 110 may be defined based on the thickness of the computing device 100 in which the passive thermal management system 102 is installed. A largest outer surface area of the vapor chamber 110 may approximately match a surface area (e.g., a largest surface area) of an inner surface 112 of the housing 104. In one example, the vapor chamber 110 is sized such that the largest outer surface area of the vapor chamber 110 is as large as will fit inside the housing 104. In other examples, the vapor chamber 110 is smaller.

Figure 2:
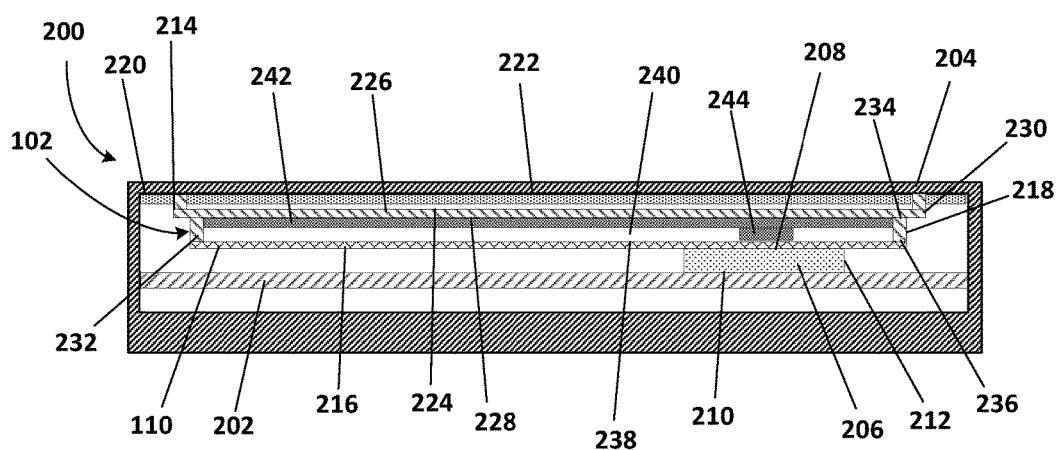
FIG. 2 depicts a cross section of a computing device including the passive thermal management system of FIG. 1.

In one example, the computing device 100 includes an enclosure plate (see FIG. 2). The enclosure plate is a plate mounted to an inner surface of the housing 104 to provide electromagnetic interference (EMI) shielding, structural support, and/or thermal spreading. The enclosure plate may be made of any number of materials including, for example, aluminum. For example, the enclosure plate may be aluminum sheet stock. The enclosure plate may be physically connected to the inner surface of the housing 104 in any number of ways including, for example, with one or more connectors. The one or more connectors may include tabs, flanges, through holes, screws, nut/bolt combinations, another connector, or any combination thereof.

In the prior art, a vapor chamber, for example, may be physically and thermally connected to the enclosure plate with, for example, adhesive and/or welds. The adhesive and/or welds increase thermal resistance between the processor, for example, the enclosure plate, and ultimately the housing. The additive manufactured vapor chamber of the present examples removes a layer of material (e.g., a top or a bottom of the vapor chamber of the prior art) and thus a joint between layers of material that would otherwise create thermal resistance, as chamber defining walls of the vapor chamber are additive manufactured directly on the enclosure plate. Such a configuration allows the thickness of the computing device to be decreased and reduces the thermal resistance between the processor 106, for example, and the housing 104. This may improve heat transfer capabilities from the vapor chamber, for example, to the housing, and ultimately out of the computing device 100.

FIG. 2 depicts a cross section of a computing device 200 including the passive thermal management system 102 of FIG. 1. The computing device 200 also includes a PCB 202 supported within a housing 204. The PCB 202 may be supported by and/or fixed to the housing 204 in any number of ways including, for example, with tabs, flanges, connectors, an adhesive, or any combination thereof. The PCB 202 supports and is electrically connected to a heat generating component 206 (e.g., a processor).

Heat is moved away from the processor 206, for example, and out of the computing device 200 with the passive thermal management system 102. The processor 206 includes a first side 208 (e.g., a top or first surface), a second side 210 (e.g., a bottom or a second surface), and at least one third side 212 that extends from the first side 208 to the second side 210. The second side 210 of the processor 206 abuts or is adjacent to the PCB 202. The first side 208 of the processor 206 abuts or is adjacent to the vapor chamber 110 of the passive thermal management system 102.

The vapor chamber 110 includes a first side 214 (e.g., a top), a second side 216 (e.g., a bottom), and at least one third side 218 that extends to the second side 216. In the example shown in FIG. 2, the at least one third side 218 is offset relative to an outer perimeter defined by the first side 214. In another example, the at least one third side 218 extends from the first side 214 to the second side 216. The second side 216 of the vapor chamber 110 abuts or is adjacent to the first side 208 of the processor 206. The second side 216 of the vapor chamber 110 may be adjacent to the first side 208 of the processor 206 in that one or more layers of additional material may be disposed between the second side 216 of the vapor chamber 110 and the first side 208 of the processor 206. For example, one or more layers of thermal adhesive may be disposed between the second side 216 of the vapor chamber 110 and the first side 208 of the processor 206.

The first side 214 of the vapor chamber 110 abuts or is adjacent to a surface (e.g., an inner surface 220) of the housing 204. The inner surface 220 of the housing 204 may be an inner surface of the housing 204 opposite the first side 214 of the vapor chamber 110. The inner surface 220 may cover a largest dimension of the housing 204 and may be part of a backing layer (e.g., a bucket) or a display module of the computing device 200. The first side 214 of the vapor chamber 110 may be adjacent to the inner surface 220 of the housing 204 in that one or more layers of material (e.g., layer of material 222) or air (e.g., a vacuum) is disposed between the first side 214 of the vapor chamber 110 and the inner surface 220 of the housing 204. The layer of material 222 may be disposed on the inner surface 220 of the housing 204 and/or on the first side 214 of the vapor chamber 110. In the example shown in FIG. 2, the layer of material 222 covers the entire inner surface 220 of the housing 204. In another example, the layer of material 222 covers less than the entire inner surface 220 of the housing 204. The first side 214 of the vapor chamber 110 may be substantially the same shape and/or size as the inner surface 220 of the housing 204 in that, for example, the housing 204 has rounded corners and the vapor chamber does not 110, or vice versa.

The layer of material 222 may be any number of materials including, for example, a wax (e.g., a refined paraffin wax that includes a binder). The binder eliminates flow after phase change. Different paraffin waxes may be used for the layer of material 222 based on the particular computing device and, more specifically, temperatures produced within the particular computing device. Different paraffin waxes have different melt peaks, different densities, and different latent heats of fusion. The paraffin wax used, for example, may be selected such that the melt peak of the paraffin wax matches a temperature at the vapor chamber 110 during operation of the computing device 200 (e.g., at maximum steady state power level and/or at a power level greater than the maximum steady state power level). When a melting point is reached, the paraffin wax begins to store heat during phase change. Depending on the amount of wax applied to the vapor chamber 110 and/or the inner surface 220 of the housing 204, for example, and the material used, sufficient cooling of the computing device 200 (e.g., without reducing power) may be provided for additional time, for example, while the computing device 200 operates above steady state power. With increased volume of the layer of material 222, the amount of additional time the computing device 200, for example, may be sufficiently cooled during higher than steady state power operation also increases.

The vapor chamber 110 may be physically attached to the PCB 202, the housing 204 (e.g., the inner surface 220 of the housing 204), another surface within the computing device 200, or any combination thereof in any number of ways. For example, the vapor chamber 110 may be physically attached with tabs, flanges, connectors, an adhesive, or any combination thereof. As shown in the example of FIG. 2, the vapor chamber 110 may be physically attached to the inner surface 220 of the housing 204 via one or more (e.g., four or eight) posts including through-holes and corresponding connectors (e.g., screws).

Part of the vapor chamber 110 is formed by an enclosure plate 224 (e.g., a first plate). The enclosure plate 224 includes a first side 226, a second side 228, and at least one third side 230 extending from the first side 226 to the second side 228. Computing devices of the prior art typically include an enclosure plate 224 physically connected to the housing of the computing device to, for example, structurally strengthen the computing device. The enclosure plate 224 of the present examples acts as the first side 214 of the vapor chamber. The enclosure plate 224 may be made of any number of thermally conductive materials including, for example, aluminum, and may be any number of sizes based on, for example, the size of the computing device into which the passive thermal management system 102 is installed. For example, the enclosure plate 224 may be an aluminum flat plate. In other examples, the enclosure plate 224 is made of copper or another material.

The vapor chamber 110 also includes walls 232 that are additive manufactured directly on the second side 228 of the enclosure plate 224. The walls 232 define a perimeter (e.g., a length and a width) and a thickness of the vapor chamber 110. The walls 232 may extend away from the second side 228 of the enclosure plate 224, at a first end 234 of the walls 232, to a second end 236 of the walls 232. The walls 232 may extend away from the second side 228 of the enclosure plate 224 in any number of directions including, for example, in a direction perpendicular to the second side 228 of the enclosure plate 224. In other examples, the walls 232 extend away from the second side 228 of the enclosure plate 224 in non-perpendicular directions relative to the second side 228 of the enclosure plate 224 (see FIG. 3).

The walls 232 are made of any number of thermally conductive materials including, for example, aluminum. In one example, the walls 232 are made of the same material as the enclosure plate 224. In another example, the walls 232 are made of a different material than the enclosure plate 224 (e.g., different alloys of the same metal or different metals).

The vapor chamber 110 also includes a layer of material 238 (e.g., a second plate, a sheet, or a foil). In one example, the second plate 238 is made of the same material as the enclosure plate 224 and/or the walls 232. In another example, the second plate 238 is made of a different material than the enclosure plate 224 and/or the walls 232. The second plate 238 may be the same size or a different size than the enclosure plate 224. The second plate 238 may have a length and a width based on the perimeter defined by the walls 232 of the vapor chamber 110. The second plate 238 may be any number of thicknesses. In one example, the thickness of the second plate 238 is set based on the computing device (e.g., the size of the computing device and/or the heat generated to be removed) in which the vapor chamber is installed. In one example, a plurality of second plates 238 are physically attached to the second end 236 of the walls 232 (e.g., at different heights due to walls 232 with non-uniform heights being additive manufactured on the enclosure plate 224).

The second plate 238 is physically attached to the second end 236 of the walls 232. The second plate 238 may be physically attached to the second end 236 of the walls 232 in any number of ways including, for example, with welding or diffusion bonding. Other methods of physically attaching the second plate 238 to the second end 236 of the walls 232 may be used.

The enclosure plate 224, the walls 232, and the second plate 238 at least partially define a chamber 240 (e.g., a vapor space) of the vapor chamber 110. In one example, the chamber 240 covers a substantial portion of the second side 228 of the enclosure plate 224 in that the perimeter defined by the walls 232 matches the perimeter of the enclosure plate 224. The chamber 240 is filled with a working fluid (e.g., water) and/or another material (e.g., a wax). The internal structure of the vapor chamber 110 is important for phase change performance. Features that affect phase change performance include the vapor space 240 and capillary features 242. The vapor space 240 is a path for evaporated working fluid to travel to a condenser of the vapor chamber 110, and the capillary features 242 are a pathway for condensed working fluid to return to an evaporator of the vapor chamber 110.

The capillary features 242 may be formed on at least a portion of the second side 228 of the enclosure plate 224, the walls 232, an extension 244 through the chamber 240, and/or the second plate 238. In the example shown in FIG. 2, a portion of the capillary features 242 extend (e.g., at extension 244) from the second side 228 of the enclosure plate 224 to the second plate 238. The extension 244 is adjacent to (e.g., centered relative to) the processor 206 to increase efficiency of the vapor chamber 110. The extension 244 provides a path for liquid to be evaporated by, for example, heat generated by the processor 206. The extension 244 may extend all of the way across the chamber 240 and separate the chamber 240 into a number of separate chambers, or the extension 240 may not extend all of the way across the vapor chamber 110. In one example, a plurality of extensions 244 including capillary features extend from the second side 228 of the enclosure plate 224 to the second plate 238, adjacent to the processor 206. As examples, the capillary features 242 may include screen wick structures, open channels, channels covered with screens, an annulus behind a screen, an artery structure, a corrugated screen, other structures, or any combination thereof. The capillary features 242 may be additive manufactured on at least a portion of the second side 228 of the enclosure plate 224, the walls 232, and/or the second plate 238. In one example, at least some of the capillary features 242 are chemically etched on at least a portion of the second side 228 of the enclosure plate 224, the walls 232, and/or the second plate 238. For example, capillary features 242 are chemically etched on the second plate 238 while additional capillary features 242 are additive manufactured on the enclosure plate 224, or the enclosure plate 224 and the walls 232.

Prior art manufacturing processes for thermal management devices include stamping, extrusion, casting, and machining. Such manufacturing processes, however, are constrained based on the material being used and the device being manufactured. Thermal management devices manufactured with these prior art processes are constrained by associated tolerances.

Tolerances for additive manufactured thermal management devices are smaller compared to the prior art manufacturing processes. Accordingly, an additive manufactured vapor chamber of one or more of the present examples may be any number of sizes and/or shapes. In one example, the additive manufactured vapor chamber is non-uniform in size and/or shape. Also, by 3D printing directly on an enclosure plate (e.g., the enclosure plate 224), different materials may be applied on different portions of the enclosure plate to control thermal resistance between the vapor chamber 110 and the housing 204 (e.g., an outer surface of the housing 204), and thus the processor 206 and the housing 204. This control of the thermal resistance aids in the provision of an isothermal surface on the housing (e.g., the outer surface of the housing 204).

Figure 3:
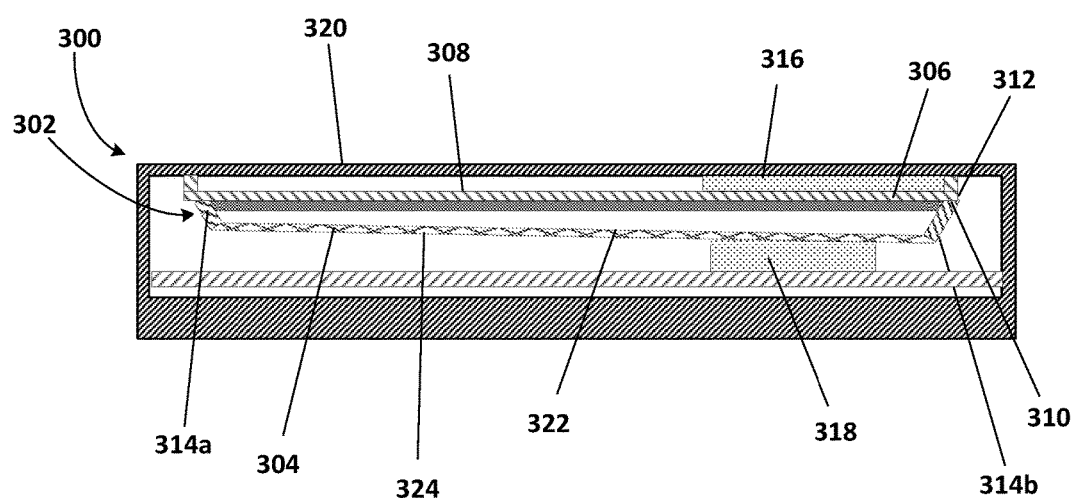
FIG. 3 depicts a cross section of a computing device including another example of a passive thermal management system.

FIG. 3 depicts a cross section of a computing device 300 including another example of a passive thermal management system 302. The passive thermal management system 302 includes a phase change device 304 such as, for example, a vapor chamber. In another example, the phase change device 304 is a heat pipe. Part of the vapor chamber 304 is formed by an enclosure plate 306 (e.g., a first plate). The enclosure plate 306 includes a first side 308, a second side 310, and at least one third side 312 extending from the first side 308 to the second side 310. The enclosure plate 306 may be made of any number of thermally conductive materials including, for example, aluminum, copper, or another material. For example, the enclosure plate 306 may be an aluminum flat plate.

The vapor chamber 304 includes walls 314 that are additive manufactured directly on the second side 310 of the enclosure plate 306. The walls 314 define a perimeter (e.g., a length and a width) and a thickness of the vapor chamber 304. The perimeter may vary along the thickness (e.g., the height) of the vapor chamber 304. In other words, the walls 314 may extend away from the second side 310 of the enclosure plate 306 in a non-perpendicular direction relative to the second side 310 of the enclosure plate 306. In the example shown in FIG. 3, opposite walls 314 extend in directions away from the second side 310 of the enclosure plate 306 and towards each other. In other words, the walls 314 extend away from the second side 310 of the enclosure plate 306 such that a cross-section of the vapor chamber 304 is trapezoidal. The trapezoidal shape of the vapor chamber 304 may provide for a structurally strong vapor chamber. In one example, a vacuum is pulled within the vapor chamber 304, and the trapezoidal shape may help prevent the vapor chamber 304 from collapsing on itself when the vacuum is pulled.

In the example shown in FIG. 3, a first portion of the walls 314a has a different height than a second portion of the walls 314b. By 3D printing the walls 314a directly onto the enclosure plate 306, any number of shapes and/or sizes (e.g., non-uniform shapes and/or sizes) may be provided for the vapor chamber 304. The non-uniform shapes and/or sizes may accommodate for components within a particular portion of the computing device 300 and/or may aid in producing an isothermal surface on the computing device 300 based on locations and amounts of heat generation within the computing device 300.

In the example shown in FIG. 3, a layer of material 316 is disposed on the first side 308 of the enclosure plate 306. The layer of material 316 may be disposed on the first side 308 of the enclosure plate 306 in any number of ways including, for example, with additive manufacturing (e.g., 3D printing). The layer of material 316 may be any number of materials including, for example, an insulating material such as a foam or a plastic. The layer of material 316 may cover less than all of the first side 308 of the enclosure plate 306. For example, the layer of material 316 may be disposed on the first side 308 of the enclosure plate 306 above a heat generating component 318 (e.g., a processor), such that a hot spot is not formed on an outer surface 320 of the computing device 300. The size and placement of the layer of material 316 may be set based on a temperature distribution on the outer surface 320 of the computing device 300 during operation of the computing device 300. In one example, the layer of material 316 covers the entire first side 308 of the enclosure plate 306. In another example, one or more additional layers of the same or a different material than the layer of material 316 may be disposed on the vapor chamber 304 (e.g., the first side 308 of the enclosure plate 306). The layer of material 316 or the layer of material 316 and the one or more additional layers of material may provide thermal resistance balancing towards the goal of an isothermal outer surface 320 of the computing device 300. In one example, no layer of material is disposed on the first side 308 of the enclosure plate 306. Instead, a vacuum is formed between the first side 308 of the enclosure plate 306 and the inner surface 220 of the computing device 300.

Other components and/or features may be disposed (e.g., additive manufactured) within and/or on the vapor chamber 304. For example, fins of a heat sink, which provide an extended area for heat rejection, may be additive manufactured on any number of surfaces within and/or on the vapor chamber 304. In one example, fins of a heat sink are additive manufactured on a surface 322 of a second plate 324 inside the vapor chamber 304.

Heat sinks of the prior art may be physically attached (e.g., soldered) to an outer surface of a phase change device (e.g., a heat pipe or vapor chamber). The attachment region creates an additional thermal resistance in a thermal management system, thus reducing overall performance of the thermal management system. Fin geometries for fins manufactured using processes of the prior art are also limited to basic shapes. By 3D printing the heat sink, the additional thermal resistance created by the attachment region is removed, the heat sink is formable within a phase change device (e.g., the vapor chamber 304), for example, and fin geometries are less limited compared to the prior art.

Other features may be additive manufactured within the thermal management system 302. For example, texturing may be disposed on any number of surfaces within the thermal management system 302. For example, texturing may be additive manufactured on the first side 308 of the enclosure plate 306. The texturing may aid in heat transfer from the vapor chamber 304 out of the computing device 300.

In the present examples, the integration of a phase change device (e.g., a vapor chamber) with an enclosure of an electronic device reduces the height of components within the electronic device, allowing a thinner electronic device to be produced or providing space for other components within the electronic device. For example, a thermal solution (e.g., including the vapor chamber) may be lowered a number of millimeters within the electronic device by forming the vapor chamber on the enclosure. Also, the utilization of a largest surface area of the electronic device for the thermal solution (e.g., covering substantially all of a largest surface area of the electronic device) maximizes heat transfer, may aid in the creation of an isothermal surface on the electronic device, and may allow for the elimination of fans within the electronic device, which reduces noise.

Figure 4:
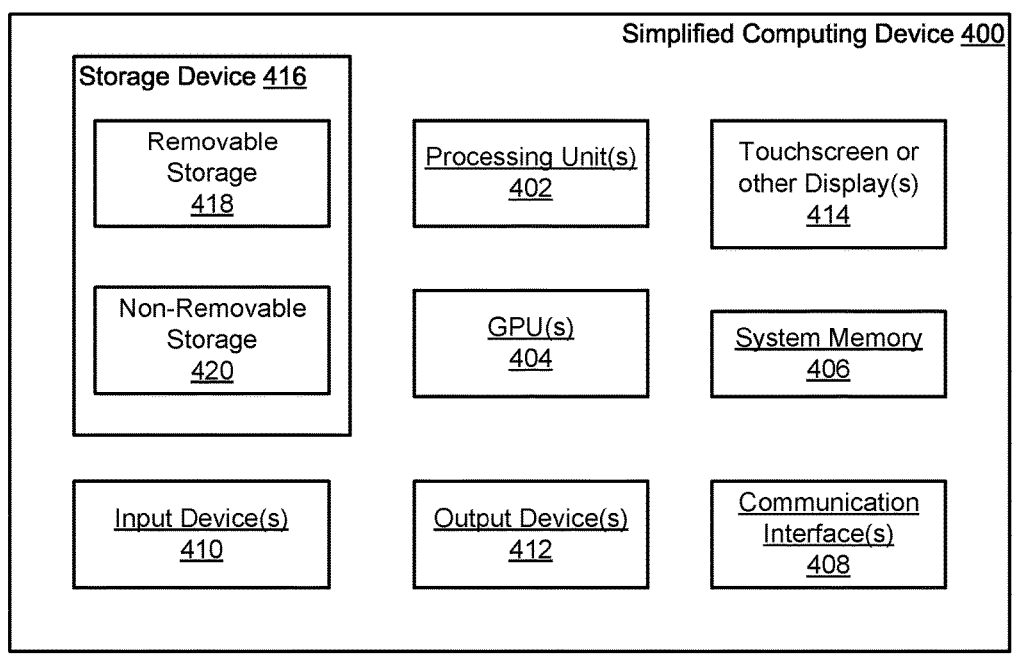
FIG. 4 is a block diagram of a computing environment in accordance with one example for implementation of the disclosed methods or one or more electronic devices.

With reference to FIG. 4, a thermal management system, as described above, may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. The thermal management system may be incorporated within a computing environment having an active cooling source (e.g., fan). In another example, the thermal management system may be incorporated within a computing environment not having an active cooling source.

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 400.

Figure 5:
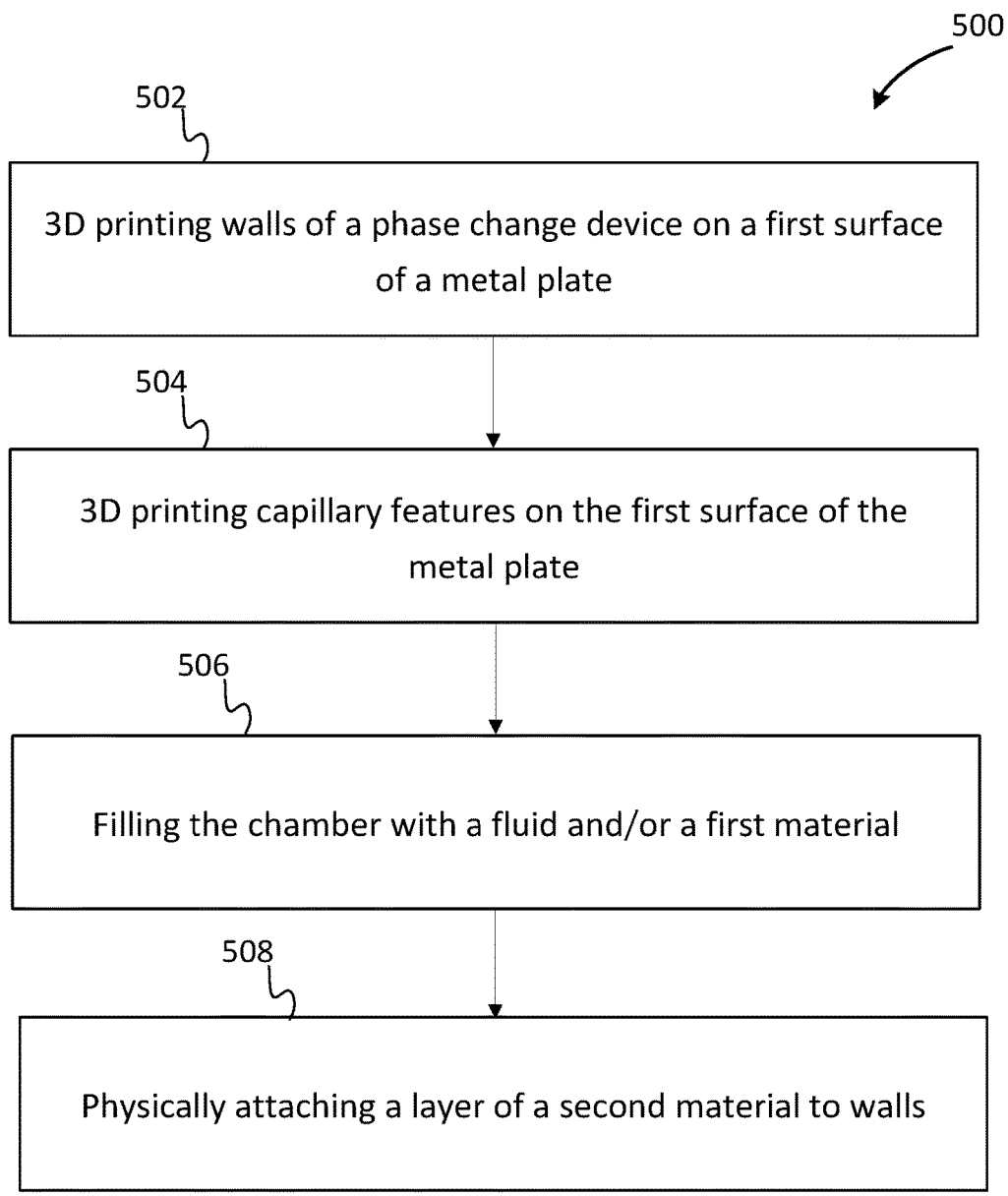
FIG. 5 is a flow diagram of a method for manufacturing a thermal management device in accordance with one example.

FIG. 5 shows a flowchart of one example of a method 500 for manufacturing a thermal management device of a computing device. The method 500 is implemented in the order shown, but other orders may be used. Additional, different, or fewer acts may be provided. Similar methods may be used for manufacturing a thermal management device.

In act 502, walls of a phase change device are produced on a first surface of a metal plate using additive manufacturing (e.g., 3D printing). In one example, the walls of the phase change device are additive manufactured directly on the first surface of the metal plate. In another example, there are one or more intervening layers of material between the metal plate and the walls. The metal plate and the walls partially define a chamber of the phase change device. In one example, the phase change device is a vapor chamber. In another example, the phase change device is a heat pipe.

Additive manufacturing may include any number of methods of manufacturing. For example, additive manufacturing may include 3D printing, selective laser melting (SLM), direct metal laser sintering (DMLS), directed energy deposition, electron beam forming, electroforming, screen printing, another form of additive manufacturing, or any combination thereof.

The 3D printing may include depositing layers of material onto a power bed with inkjet printer heads. In one example, the 3D printing is stencil 3D printing. Alternatively or additionally, the 3D printing may include an extrusion-based process, a sintering-based process, or another process. In an extrusion-based process, small beads of material are extruded, and the small beads of material harden to form the layers. In a sintering-based process, heat and/or pressure is used to compact and/or form the layers (e.g., with a laser). The successive layers of material may be deposited under computer control based on a 3D model to produce an object (e.g., the vapor chamber).

The walls of the phase change device are additive manufactured such that each of the walls has a first end and a second end, and extends away from the first surface of the metal plate, at the first end, to the second end. The walls of the phase change device may be additive manufactured on the first surface of the metal plate such that the walls extend away from the first surface of the metal plate in any number of directions relative to the first surface of the metal plate. In one example, the walls extend away from the first surface of the metal plate in a direction perpendicular to the first surface of the metal plate. In another example, at least one of the walls extends away from the first surface of the metal plate in a non-perpendicular direction relative to the first surface of the metal plate.

The metal plate may be an enclosure plate of the computing device. The enclosure plate provides EMI shielding, structural support, and/or a thermal path for heat out of the computing device. By, for example, 3D printing the walls directly on the enclosure plate of the computing device, the computing device may be thinner compared to a computing device of the prior art in which a phase change device is positioned at a distance from or is physically attached to the enclosure plate. The enclosure plate may be made of any number of thermally and/or electrically conductive materials including, for example, aluminum. In one example, the phase change device is formed (e.g., additive manufactured) on another surface within the computing device (e.g., an inner surface of a housing of the computing device).

The walls of the phase change device may be additive manufactured using any number of materials. For example, the walls of the phase change device may be additive manufactured using copper, aluminum, titanium, gold, another thermally conducting material, or any combination thereof. As one example, the walls of the phase change device are additive manufactured using two or more materials (e.g., copper and aluminum). In one example, the walls of the phase change device are additive manufactured using the same material of which the enclosure plate is made (e.g., aluminum). In another example, the walls of the phase change device are additive manufactured using a material (e.g., copper) that is different than the material of which the enclosure plate is made. The walls may be any number of shapes and/or sizes. The size and/or shapes of the walls may be uniform or non-uniform. For example, at least one of the walls has a larger height compared to the other walls. In one example, a single, circular wall is printed directly on the enclosure plate.

In act 504, capillary features of the phase change device are produced on the first surface of the metal plate using additive manufacturing (e.g., 3D printing). As examples, the capillary features may include screen wick structures, open channels, channels covered with screens, an annulus behind a screen, an artery structure, a corrugated screen, other structures, or any combination thereof. In one example, the capillary features of the phase change device are formed directly on the first surface of the metal plate. In another example, there are one or more layers of intervening layers of material between the metal plate and the capillary features.

The capillary features may be additive manufactured using any number of materials including, for example, copper, aluminum, titanium, gold, another thermally conducting material, or any combination thereof. In one example, the capillary features are additive manufactured using two or more materials (e.g., copper and aluminum). In one example, the capillary features are additive manufactured using the same material as the enclosure plate and/or the walls. In another example, the capillary features are additive manufactured using a material different than the materials used for the enclosure plate and/or the walls.

In one example, the capillary features are additive manufactured on only the enclosure plate. In another example, the capillary features are not formed on the enclosure plate. Instead, the capillary features are additive manufactured along the height of the walls or are additive manufactured integral with the walls. In yet another example, the capillary features are additive manufactured on the enclosure plate and with the walls. In one example, the capillary features are additive manufactured on the enclosure plate, and a portion of the capillary features are additive manufactured such that the portion extends from the enclosure plate to a layer of second material opposite the enclosure plate. A cross-section of the portion may match a size and a shape of a heat generating component supported within the computing device.

In act 506, the chamber is filled with a fluid, a first material, or the fluid and the first material. The fluid may be a working fluid of the vapor chamber, for example. The working fluid may be selected such that with a maximum heat flux within the computing device, the working fluid does not dry-out. The working fluid may be any number of fluids including, for example, ammonia, alcohol, ethanol, or water.

In one example, the chamber is filled with another material. For example, the chamber may be filled with, for example, a wax to store thermal energy when the computing device is operated at a high processing speed for an extended period of time. In other words, the chamber may be filled with the wax to increase the thermal capacitance of the thermal management system within the computing device.

In act 508, the layer of a second material is physically attached to the second end of the walls. The layer of the second material may be a plate the same as or similar to the enclosure plate (e.g., an aluminum plate). In one example, the layer of the second material is a foil-like material (e.g., a foil). The size and/or shape of the layer of the second material may match a perimeter of the vapor chamber formed at the second end of the walls. Capillary features may be additive manufactured on or chemically etched in the layer of the second material. Alternatively, the layer of the second material may not include any capillary features.

In one example, the layer of the second material is physically attached to the second end of the walls before the chamber is filled with, for example, the working fluid. The walls of the vapor chamber may be additive manufactured in act 502 to include a port for filling the vapor chamber with the working fluid. The port may be sealed (e.g., mechanically or with heat) after the vapor chamber is filled with the working fluid.

The layer of the second material may be physically attached to the second end of the walls in any number of ways. For example, the layer of the second material is physically attached to the second end of the walls with welding, diffusion bonding, or another attachment method. In one example, a plurality of layers of material (e.g., made of a same material or different materials) are physically attached to different sections of the walls. For example, different sections of the walls may have different heights, and separate layers of material may be physically attached to the different sections of the walls, respectively, using welding or diffusion bonding.

In one example, the walls and the capillary features are additive manufactured on the first surface of the metal plate with a first material, and one or more layers of a second material are additive manufactured on a second surface of the metal plate. The metal plate may be a flat plate, and the second surface may be opposite the first surface. The second material may be a thermally insulating material (e.g., a foam or a plastic). The one or more layers of the second material may cover less than all of the second surface of the metal plate, and the one or more layers of the second material may be positioned on the second surface of the metal plate to control thermal resistance between a heat generating component physically connected to the vapor chamber, for example, and an outer surface of the computing device. For example, a layer of thermally insulating material may be additive manufactured on the second surface of the metal plate, in a location opposite where the heat generating component of the computing device is to be installed. The control of thermal resistance may aid in providing an isothermal outer surface of the computing device. In one example, the thermal resistance control aids in the minimization of heat transfer to the outer surface of the computing device to avoid hot spots on the outer surface of the computing device. For example, if the phase change device (e.g., a surface area of the phase change device) is small relative to the inner surface of the housing of the computing device, a hot spot may otherwise form without the thermally insulating material disposed on the second surface of the metal plate and/or the inner surface of the housing of the computing device.

In another example, at least one connector is additive manufactured on the metal plate, as part of the walls, and/or on the layer of the second material. The at least one connector may include one or more flanges, tabs, through-holes, or other connectors for physically attaching the vapor chamber, for example, to a housing of the computing device and/or other components within the computing device.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a thermal management device includes a plate having a first surface. The first surface partially defines a chamber of the thermal management device. The thermal management device also includes capillary features disposed on or in the plate. The thermal management device includes walls having a first end and a second end. The walls are disposed on the plate and extend away from the first surface of the plate, at the first end, to the second end. The walls partially define the chamber of the thermal management device. The thermal management device includes a layer of material disposed on the second end of the walls. The layer of material partially defines the chamber.

In a second embodiment, with reference to the first embodiment, the plate is an enclosure plate of an electronic device.

In a third embodiment, with reference to the second embodiment, the chamber covers a substantial portion of the first surface of the enclosure plate.

In a fourth embodiment, with reference to the first embodiment, the plate, the capillary features, the walls, and the layer of material are made of a first material.

In a fifth embodiment, with reference to the fourth embodiment, the thermal management device further includes a fluid, a second material, or the fluid and the second material inside the chamber. The second material is different than the first material.

In a sixth embodiment, with reference to the first embodiment, the layer of material is a first layer of material. The plate has a second surface. The second surface is opposite the first surface. The thermal management device further includes a second layer of material. The second layer of material is disposed on the second surface of the plate.

In a seventh embodiment, with reference to the sixth embodiment, the second layer of material covers less than all of the second surface of the plate. The second layer of material is a thermal insulator.

In an eighth embodiment, with reference to the first embodiment, at least one of the walls extends in a non-perpendicular direction relative to the plate.

In a ninth embodiment, with reference to the first embodiment, a height of at least one of the walls varies along the plate. A shape of a first portion of the thermal management device is different than a shape of a second portion of the thermal management device, or a combination thereof.

In a tenth embodiment, a computing device includes a heat generating electronic component. The computing device also includes a housing that supports the heat generating component. The housing has an inner surface and an outer surface. The computing device includes a thermal management device supported by the housing. The thermal management device includes a plate having a first surface and a second surface. The second surface of the plate faces the inner surface of the housing. The plate partially defines a chamber of the thermal management device. The thermal management device also includes walls having a first end and a second end. The walls are disposed on the plate and extend away from the first surface of the plate, at the first end, to the second end. The walls partially define the chamber of the thermal management device. The thermal management device also includes a layer of first material disposed on the second end of the walls. The layer of material partially defines the chamber. The thermal management device includes a fluid, a second material, or the fluid and the second material disposed in the chamber.

In an eleventh embodiment, with reference to the tenth embodiment, the second surface of the plate is substantially the same shape and size as the inner surface of the housing.

In a twelfth embodiment, with reference to the tenth embodiment, the plate and the walls are made of the first material or a third material.

In a thirteenth embodiment, with reference to the tenth embodiment, the computing device further includes a layer of third material disposed between the second surface of the plate and the inner surface of the housing. The layer of third material has a first surface and a second surface. The first surface of the layer of third material is in physical contact with the second surface of the plate, and the second surface of the layer of third material is in physical contact with the inner surface of the housing.

In a fourteenth embodiment, with reference to the thirteenth embodiment, the layer of third material is made of wax.

In a fifteenth embodiment, with reference to the tenth embodiment, the thermal management device further includes capillary features disposed on the first surface of the plate.

In a sixteenth embodiment, with reference to the tenth embodiment, the plate is an enclosure plate of the housing.

In a seventeenth embodiment, a method for manufacturing a thermal management device includes additive manufacturing walls of a phase change device on a first surface of a metal plate, such that the wall has a first end and a second end, and extends away from the first surface of the metal plate, at the first end, to the second end. The metal plate and the walls partially define a chamber. The method also includes additive manufacturing capillary features on the first surface of the metal plate, filling the chamber with a fluid, a first material, or the fluid and the first material, and physically attaching a layer of second material to the second end of the walls.

In an eighteenth embodiment, with reference to the seventeenth embodiment, additive manufacturing the walls includes 3D printing the walls on the first surface of the metal plate using the second material or a third material. The method also includes 3D printing a fourth material on a second surface of the metal plate. The second surface of the metal plate is opposite the first surface of the metal plate.

In a nineteenth embodiment, with reference to the seventeenth embodiment, physically attaching the layer of second material to the second end of the walls includes welding or diffusion bonding the layer of second material onto the second end of the walls.

In a twentieth embodiment, with reference to the seventeenth embodiment, the method further includes 3D printing at least one connector on the metal plate, the walls, the layer of second material, or any combination thereof. The thermal management device is connectable to an inner surface of a housing of an electronic device via the at least one connector.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
   a heat generating electronic component;
   a housing that supports the heat generating electronic component, the housing having an inner surface and an outer surface; and
   a thermal management device supported by the housing, the thermal management device comprising:
      a plate mounted to the inner surface of the housing, the plate having a first surface and a second surface opposite the first surface, the second surface of the plate facing the inner surface of the housing, the first surface of the plate partially defining a chamber of the thermal management device;
      walls each having a first end and a second end, each of the walls being disposed on the plate and extending away from the first surface of the plate, at the first end, to the second end, respectively, the walls partially defining the chamber of the thermal management device; and
      a layer of first material disposed on the second end of the walls, the layer of first material partially defining the chamber; and
      a fluid and a second material disposed in the chamber; and
   a layer of a third material disposed between the second surface of the plate and the inner surface of the housing.

2. The computing device of claim 1, wherein the second surface of the plate is substantially the same shape and size as the inner surface of the housing.

3. The computing device of claim 1, wherein the plate and the walls are made of the first material or a fourth material.

4. The computing device of claim 1, wherein the layer of third material is made of a wax.

5. The computing device of claim 1, wherein the thermal management device further comprises capillary features disposed on the first surface of the plate.

6. The computing device of claim 1, wherein the plate is an enclosure plate of the housing.

7. The computing device of claim 1, wherein the second material is configured as capillary features, the capillary features being disposed on the first surface of the plate.

* * * * *